United States Patent [19]

Kinzer

[11] Patent Number: 4,721,986
[45] Date of Patent: Jan. 26, 1988

[54] BIDIRECTIONAL OUTPUT SEMICONDUCTOR FIELD EFFECT TRANSISTOR AND METHOD FOR ITS MAUFACTURE

[75] Inventor: Daniel M. Kinzer, Riverside, Calif.

[73] Assignee: International Rectifier Corporation, Los Angeles, Calif.

[21] Appl. No.: 878,196

[22] Filed: Jun. 25, 1986

Related U.S. Application Data

[62] Division of Ser. No. 581,785, Feb. 21, 1984, abandoned.

[51] Int. Cl.[1] ..................... H01L 29/78; H01L 27/04; H01L 29/52; H01L 31/00
[52] U.S. Cl. ............................... 357/23.4; 357/23.14; 357/43; 357/46; 307/571
[58] Field of Search ............... 357/23.4, 43, 46, 23.14; 307/571

[56] References Cited

U.S. PATENT DOCUMENTS

| | | | |
|---|---|---|---|
| 3,484,865 | 12/1969 | Nienhuis | 357/43 |
| 3,719,864 | 3/1973 | Taniguchi et al. | 357/23.4 |
| 4,058,822 | 11/1977 | Awane et al. | 357/23.4 |
| 4,072,975 | 2/1978 | Ishitani | 357/23.4 |
| 4,300,150 | 11/1981 | Colak | 357/23.4 |
| 4,574,209 | 3/1986 | Lade et al. | 357/43 |
| 4,635,088 | 1/1987 | Eguchi | 357/46 |

Primary Examiner—Martin H. Edlow
Assistant Examiner—John Lamont
Attorney, Agent, or Firm—Ostrolenk, Faber, Gerb & Soffen

[57] ABSTRACT

A high voltage bidirectional output semiconductor field effect transistor (BOSFET) is disclosed which is turned on from the electrical output of a photovoltaic stack which is energized from an LED. The process for manufacture of the device is also disclosed. The BOSFET device consists of two lateral field effect transistors formed in an implanted N(−) region in a P(−) substrate. Two spaced drain regions feed inwardly toward a common N(+) source region separated from the drains by respective P type diffusions. The surface of these diffusions can be inverted by application of voltage to the suitably disposed gate electrode. The depletion field between channel and drain regions is well controlled over the surface of the device. The source contact remains close to the potential of the gate contact at all times so that the device can be used for high voltage switching of either polarity. A diode, PNP transistor and resistor are integrated into the same chip containing the lateral BOSFET device to form a solid state relay circuit having characteristics similar to a reed relay. The diode defines a forward conduction path from a photovoltaic pile voltage source directly to the BOSFET gate so that the BOSFET gate capacitance can be quickly charged during turn-on. The PNP transistor is a high gain transistor coupled to the diode and to the input resistance of the circuit. The input impedance of the circuit is reduced by the gain of the transistor when the photovoltaic output voltage is turned off and its voltage drops to below the gate voltage by about 0.6 volt to turn on the transistor. This allows the BOSFET to quickly turn off as though the circuit had a relatively low input impedance. Another control circuit is disclosed which employs a dV/dt suppression clamp circuit and a regenerative turn-off circuit.

28 Claims, 15 Drawing Figures

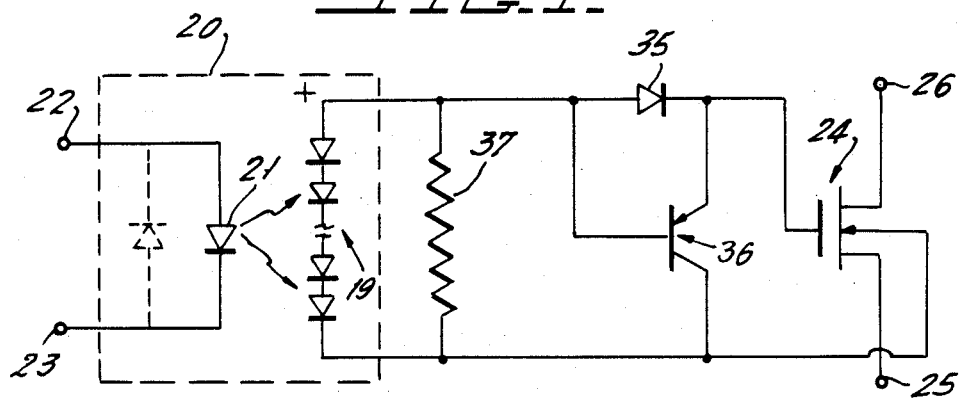
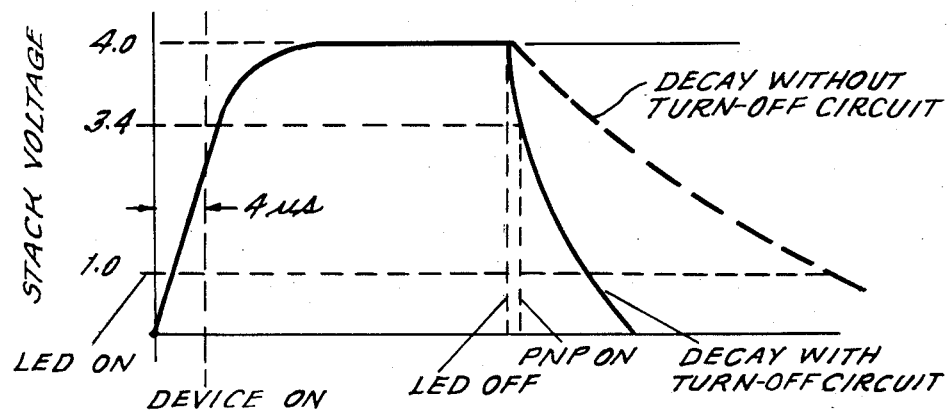
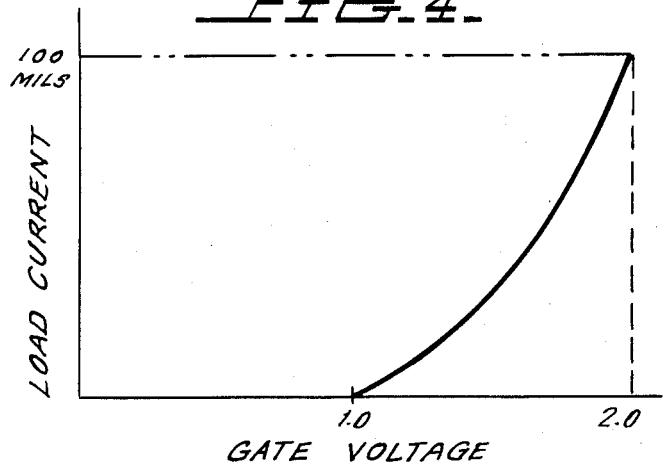
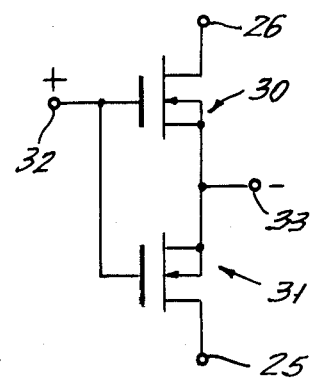

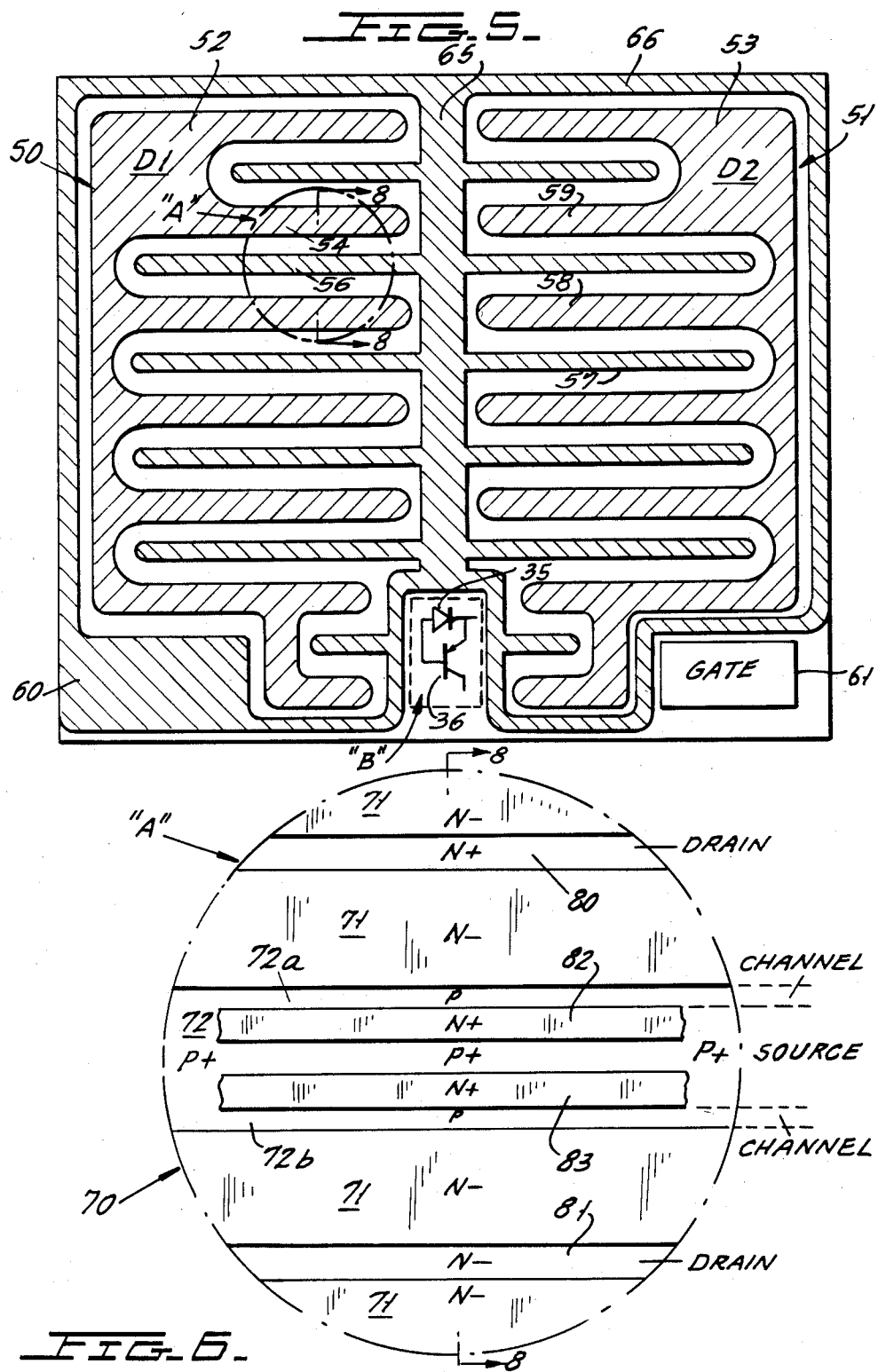

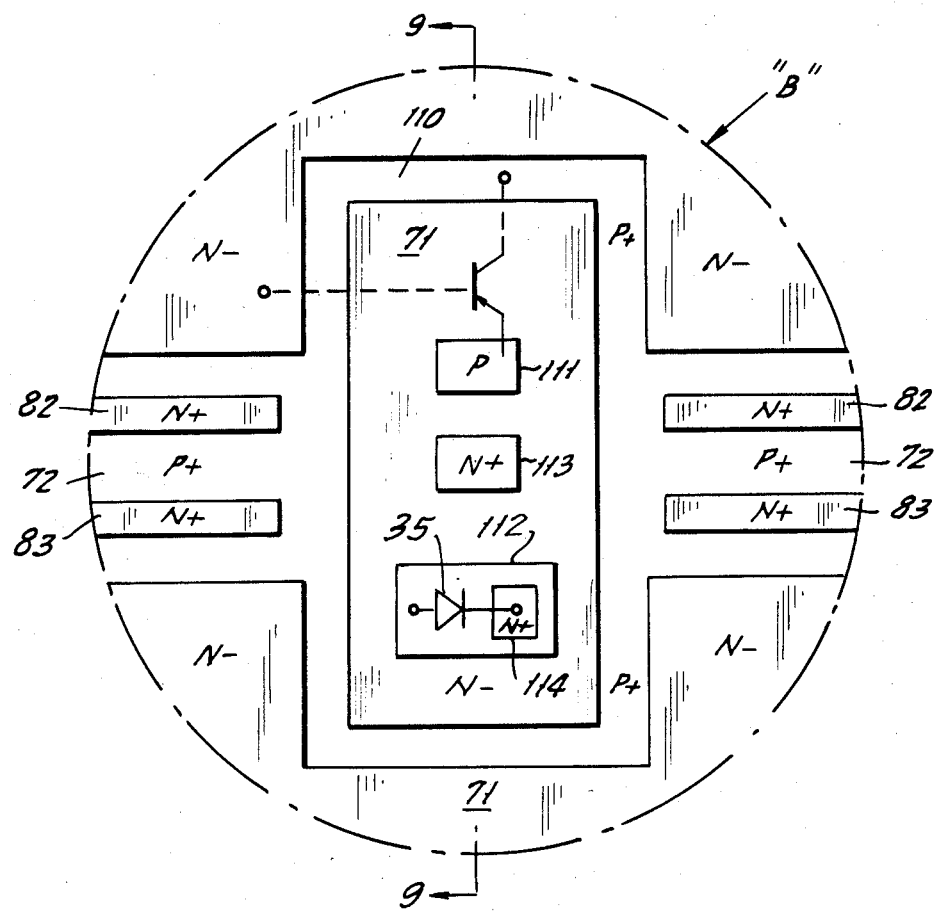
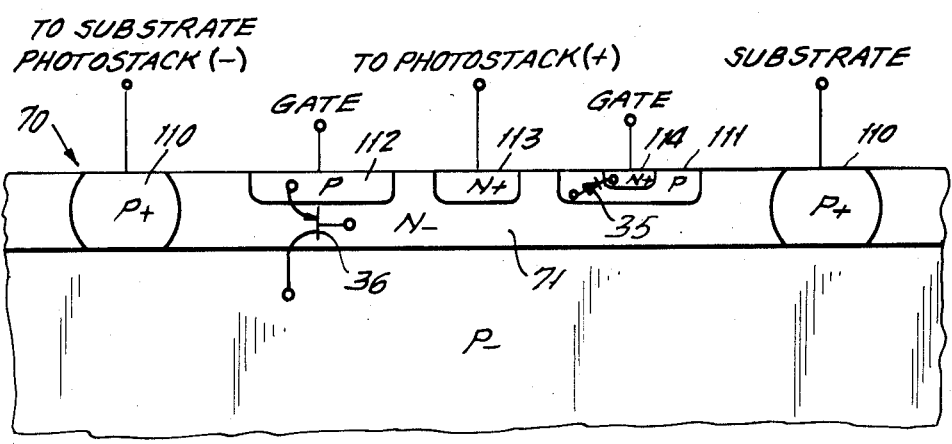

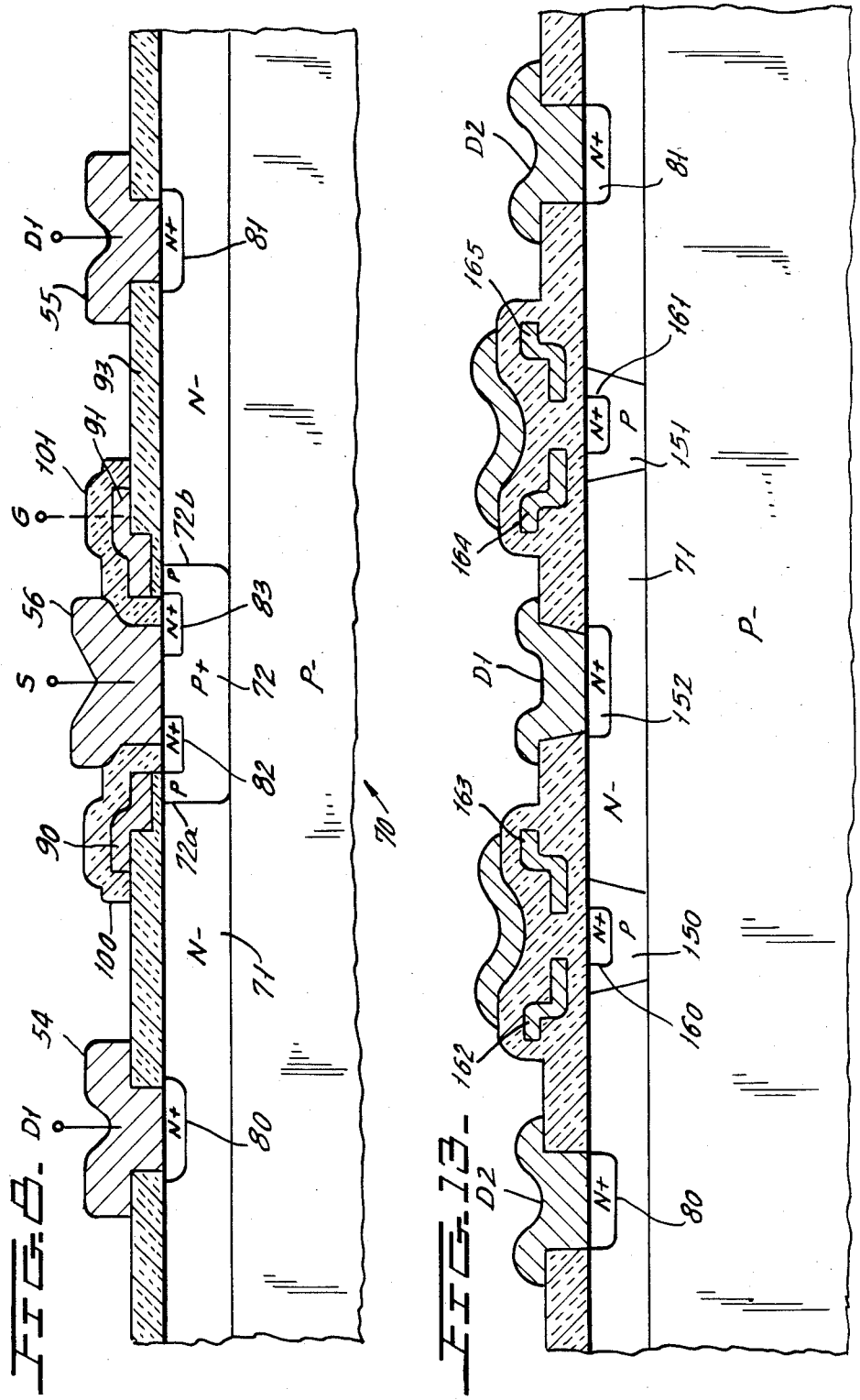

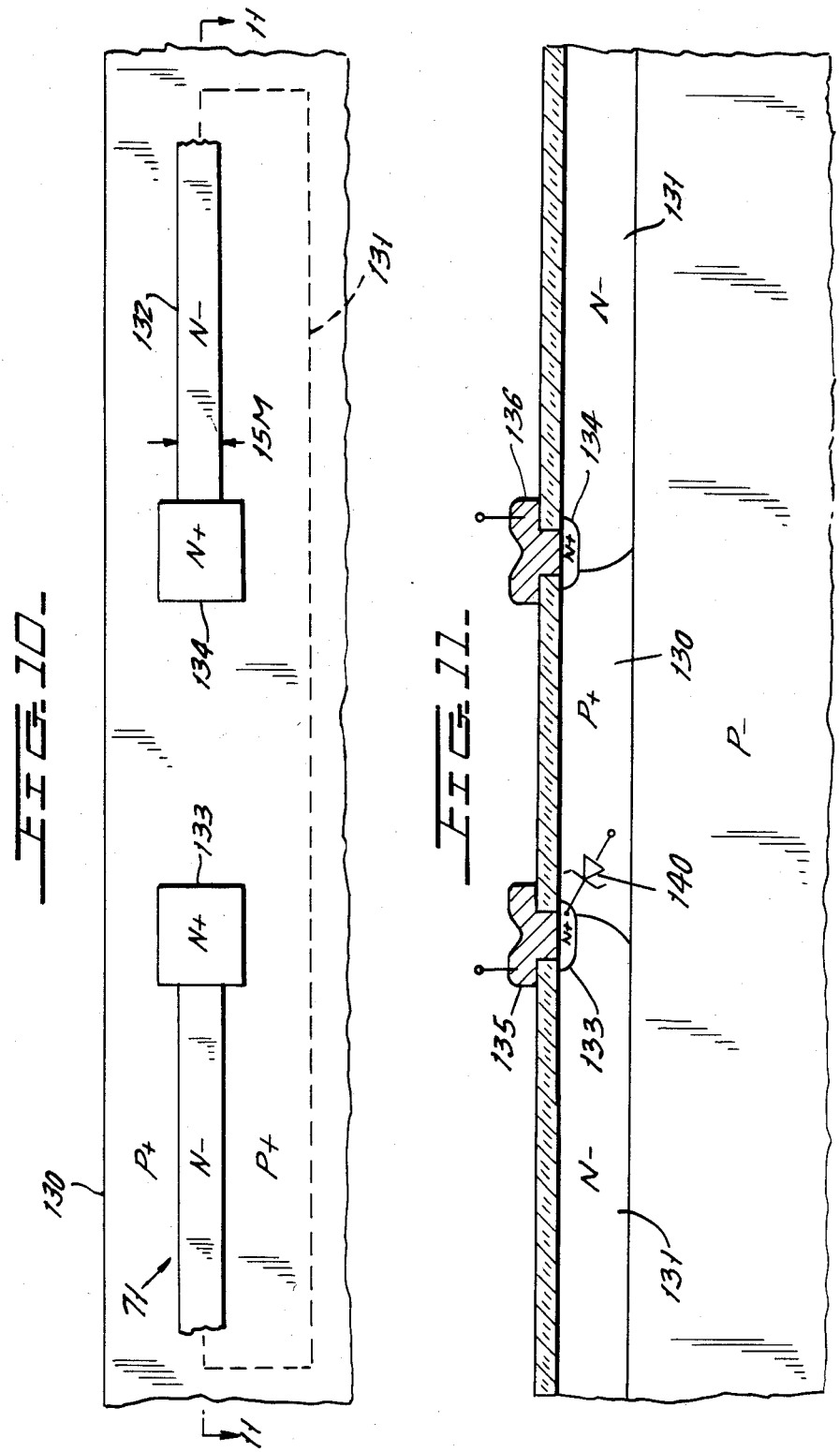

BIDIRECTIONAL OUTPUT SEMICONDUCTOR FIELD EFFECT TRANSISTOR AND METHOD FOR ITS MAUFACTURE This is a division of application Ser. No. 581,785, filed Feb. 21, 1984.

RELATED APPLICATIONS

This application is related to copending applications Ser. No. 581,784, filed Feb. 21, 1984, in the name of Howard William Collins, entitled "Fast Turn-Off Circuit for Photovoltaic Driven MOSFET" and Ser. No. 573,305, filed Jan. 23, 1984, in the name of Daniel M. Kinzer, entitled "Photovoltaic Isolator and Process of Manufacture Thereof".

BACKGROUND OF THE INVENTION

This invention relates to solid state relays and more specifically relates to a solid state relay employing a novel field effect transistor and a novel control circuit integrated with the field effect transistor structure.

Reed relays are well known electromechanical relays in widespread use. Such relays have a limited lifetime, for example, of the order of about one million operations and are relatively large and expensive. Efforts have been made to replace reed relays by relays employing solid state components. These efforts to date, however, have not produced a unit which is generally competitive, in terms of characteristics or economics, with a reed relay type device.

Thus, commercially available solid state relays almost universally use thyristors (SCRs or triacs) as output devices. Anti-parallel connected SCRs are disclosed (for s-c application only) in application Ser. No. 178,689, filed Aug. 18, 1980, in the names of Alexander Lidow and Thomas Herman, entitled "Process for Manufacture of High Power MOSFET with Laterally Distributed High Carrier Density Beneath the Gate Oxide". Thyristors, however, are poor analogs of an ideal electromechanical switch. For example, thyristors have a minimum 0.6 volt on-state voltage drop, must have polarity reversal to turn them off, require a onehalf cycle turn-off time, and have high holding currents and high reverse leakage currents. Thus, thyristor devices are generally unsatisfactory for applications such as general purpose instrument switching which continues to rely on reed switches. The use of anti-parallel connected thyristors is also disclosed in U.S. Pat. No. 4,296,331.

Solid state relays employing a MOSFET rather than thyristor forms an excellent solid state analog of the ideal conduction/blocking characteristics of a pair of mechanical contacts. Bidirectional conduction MOSFETs can control either a-c or d-c circuits, thereby forming a truly universal contact.

One typical prior art solid state relay is that shown in U.S. Pat. No. 4,227,098 which employs a conventional bidirectional conduction MOSFET which is driven into conduction from the output of an optocoupler which provides dielectric insulation between the input and output circuits of the relay. This device, however, has the conventional voltage limitation of bidirectional MOSFETs and can only be used as a low voltage device (for example, lower than about 20 volts) since the device voltage is limited by the breakdown voltage of the gate oxide. The above patent also requires external schottky devices which will break down before the PN junction between the substrate and main electrodes becomes forward-biased to cause a parasitic bipolar transistor to begin conducting. The device of the above patent is also a low speed turn-off device since the very high input impedance required for high speed turn-on also limits the turn-off speed of the circuit.

In order to overcome the inherent low voltage limitation on bidirectional field effect transistors, it is common to employ a vertical conduction power MOSFET in which the source and gate are always close to one another in voltage. Such vertical conduction high voltage MOSFETs, however, are unidirectional conducting devices and thus are useful only for d-c applications, unless at least two such devices are connected to permit bidirectional conduction. A high-voltage solid state relay having integrated components and driven by the output of a photovoltaic device is disclosed in U.S Pat. No. 4,390,790. The circuit shown in this patent employs two vertical unidirectional power MOSFETs connected in circuit arrangement to define a bidirectional current path. Two separate gate drives are required and, moreover, two separate photovoltaic sources are required, one for turning on the two MOSFETs and the other for driving a depletion JFET to produce a discharge circuit for the main power MOSFET gate circuits in an acceptably short time.

Other relay circuits of this general type are shown in U.S. Pat. No. 4,303,831 and 4,307,298.

BRIEF DESCRIPTION OF THE INVENTION

In accordance with the present invention, a novel high voltage bidirectional output switch field effect transistor (BOSFET) structure is provided which employs two laterally integrated field effect transistors having a common central source region. The device is preferably operated by the output of an optocoupler or photovoltaic isolator circuit. Two outer drain regions of the device are connected to a central source region through respective enhancement type channel regions which can be inverted to connect the two outer spaced drains to one another through a relatively low resistance conduction path between the two drain electrodes. For example, a resistance path lower than about 2 ohms can be formed. This resistance is generally compatible with most applications using reed relays.

The novel junction configuration employs reduced surface fields of novel configuration. Thus, with the invention, two channel regions are symmetrically disposed between two depletion regions. A common source connection communicates between the separated drain regions. The channel regions are P regions disposed within an implanted N(−) region each formed atop a P(−) body. Control circuit components are integrated into the BOSFET chip. In one embodiment, a diode and a PNP transistor are formed in the N(−) layer, where the diode is formed in a P type well while the PNP transistor employs the N(−) region as its base region. The two main drain regions are isolated from each other and the N(−) region for the PNP transistor and diode by a deep P+isolation diffusion.

The voltage between the drain regions when the device is off can be of the order of 100–1,000 volts to make the relay compatible with general reed relay application. This relatively high voltage is possible since the high output voltage is blocked across the lateral N(−) drift region and never across the gate oxide, whether the relay is controlling a-c or is d-c voltage. Consequently, even though the device output voltage is high, an extremely thin gate oxide can be used to make the gate very sensitive, and so that the device can be turned on by relatively low input voltages with a relatively low current source. As a result, the device can be turned on by the output of an optocoupler or photovoltaic initiator of the type disclosed in my copending application Ser. No. 573,305, filed Jan. 23 1984, entitled "Photovoltaic Isolator and Process of Manufacture Thereof". Thus, the semiconductor switching device, or BOSFET, is a high voltage, relatively low on resistance device, which has an extremely sensitive gate turn-on characteristic.

Note that the device of the invention can be used in any general application and could, for example, serve as a direct replacement for existing thyristors or triacs. The device is also applicable for use as the power switching component of a solid state relay which has the other relay components integrated into the same chip with the power switching element.

A novel solid state relay circuit is also provided which permits the use of a single photovoltaic initiator output for driving the BOSFET into conduction with the circuit having relatively high input turn-on impedance, to limit the requirements of the size of the photovoltaic initiator structure, and a low input turn-off impedance to provide high speed turn-off time. The novel circuit provides a novel transistor which may be a high gain PNP transistor integrated into the device which cooperates with the input impedance and a charging diode in such a manner that, when the photovoltaic isolator voltage begins to collapse and reaches a diode drop below the gate voltage the PNP transistor turns on and reduces the effective input impedance of the relay by a factor equal to the gain of the transistor. Therefore, during turn-off, the circuit has the characteristic of a relatively low input impedance circuit and the BOSFET gate capacitance can discharge quickly, thereby to quickly turn off the device. The high-speed turn-off circuit may also include a MOSFET control transistor connected in circuit relation with an NPN transistor and the above diode to define a regenerative circuit for discharging both the BOSFET gate capacitance and the photovoltaic stack.

Note that the novel solid state control circuit which is disclosed as integrated into a single chip with the BOSFET can also be used to drive conventional FET devices.

The novel solid state relay of the invention has many advantages over existing relays in the market, including the electromechanical reed relay. Thus, the novel circuit of the invention can switch either a-c or d-c voltages and has extremely small leakage current when in the off state, which is characteristic of MOSFET type devices. It also has extremely low thermal offset voltage and generates no electromagnetic interference radiation when closed. It is also perfectly resistive in the on state, having no minimum holding current or output voltage. It can thus accurately transmit analog signals. Moreover, it requires as little as 1-2 milliwatts of input power to remain in the "on" state. Furthermore, the device can turn on and off within a few microseconds, as contrasted to the milliseconds required to operate a reed relay or a conventional solid state relay. The load current capacity of the device of the invention is limited only by chip size and junction geometry and can be of the order of 500–1,000 milliamperes to satisfy the load current ratings of conventional reed relays. It also has extremely long operating life, in excess of a trillion operations. The overall device can be housed in any desired kind of package, for example a 16 pin DIP housing similar to that now used by reed relays and other conventional solid state relays.

BRIEF DESCRIPTION OF THE DRAWINGS

FIG. 1 is a circuit diagram of a first embodiment of the novel circuit of the invention which may be integrated into a single chip.

FIG. 2 shows the equivalent circuit diagram of the novel bidirectional output semiconductor field effect transistor shown in FIG. 1.

FIG. 3 shows the characteristic output voltage as a function of time for the photovoltaic isolator circuit portion of FIG. 1.

FIG. 4 shows the current transfer characteristic of the relay circuit of FIG. 1.

FIG. 5 is a plan view of a single chip containing the output circuit of FIG. 1 and in particular shows the drain and source metallizing patterns.

FIG. 6 is an enlarged view of the wafer surface and of the junctions emerging thereon in the circled region A of FIG. 5.

FIG. 7 is an enlarged view of the junction pattern in the dotted enclosed region B of FIG. 5 and shows the PNP transistor and diode junction of the circuit of FIG. 1 integrated into the chip surface.

FIG. 8 is a cross-sectional view of FIG. 6 taken across the section line 8—8 in FIGS. 5 and 6 and shows the basic junction pattern used for the BOSFET device.

FIG. 9 is a cross-sectional view taken across the section line 9—9 in FIG. 7 and shows the junction pattern for the transistor and diode of FIG. 1.

FIG. 10 is a top view of a portion of the periphery of the chip of FIG. 5 and illustrates the input resistor.

FIG. 11 is a cross-sectional view of FIG. 10, taken across the section line 11—11 in FIG. 10.

FIG. 13 is a cross-sectional diagram of FIG. 12 taken across section line 13—13 in FIG. 12.

DETAILED DESCRIPTION OF THE INVENTION

Figure 12:
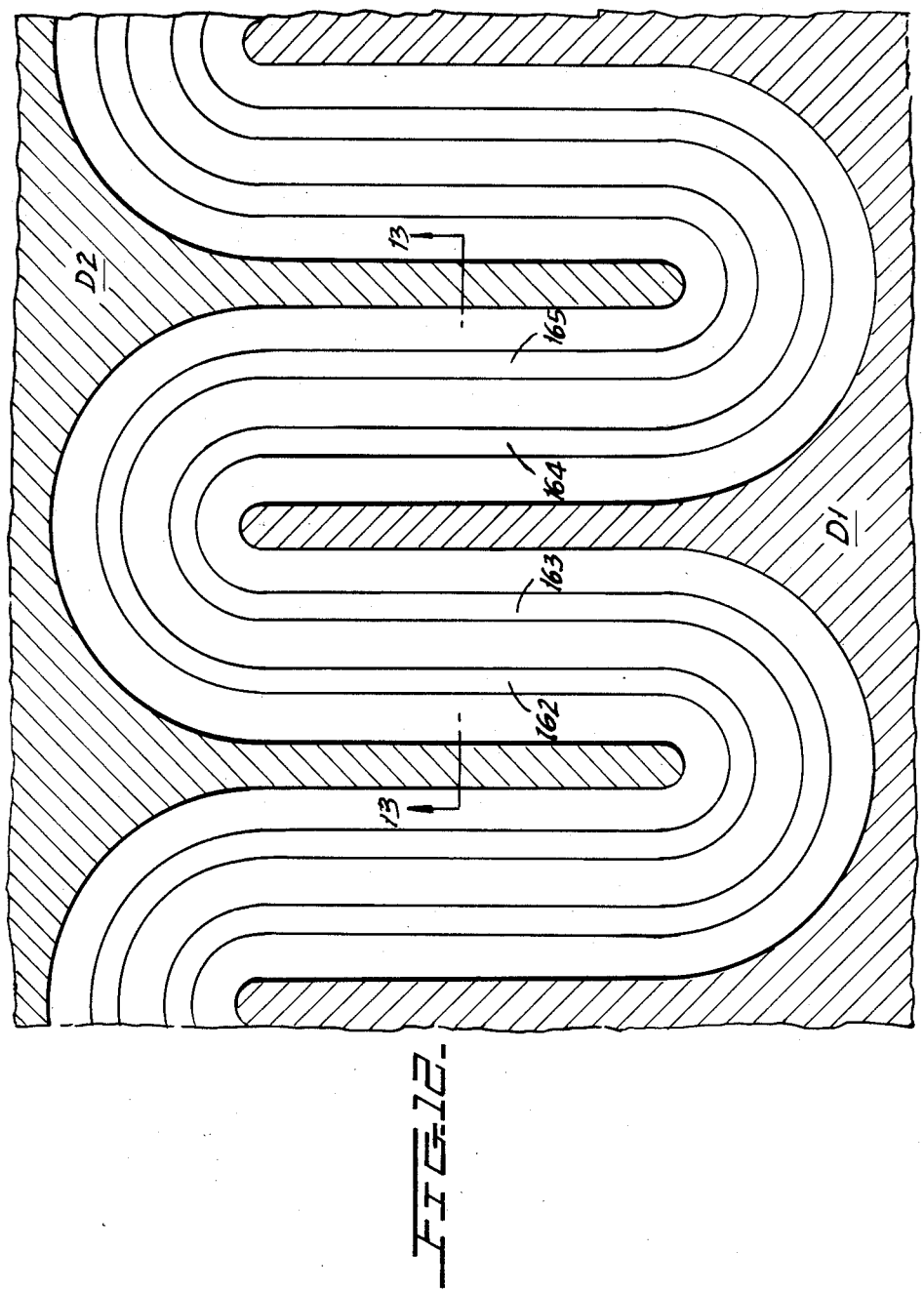
FIG. 12 is a plan view of a second embodiment of the BOSFET of the invention.

Referring first to FIG. 1, there is shown therein one embodiment of a circuit which can be employed to produce a solid state relay employing the BOSFET and control circuit of the invention. A photoisolator or optocoupler is shown in an enclosed dotted line 20 in FIG. 1, and may be identical to that described in my copending application Ser. No. 573,305, filed Jan. 23, 1984, referred to above, which is incorporated by reference into the present application. Photovoltaic isolator 20 consists of an LED 21 connected to relay input terminals 22 and 23 and a stack of photovoltaic diodes 19 which produce an output current when illuminated by LED 21. LED 21 or modifications thereof can be excited by either an a-c or d-c input to terminals 22 or 23. In the embodiment shown, a d-c input source will be connected to the terminals 22 and 23 in order to turn the LED 21 on and off. By way of example, the input circuit can be arranged to apply about 10 milliamperes to the LED 21 in order to excite the LED.

The remainder of the circuit of FIG. 1 includes solid state relay components for turning on and off the novel BOSFET 24 which has output terminals 25 and 26. The output terminals 25 and 26 can be connected in either an a-c or a d-c circuit since device 24 has bidirectional conduction characteristics, although the device is a high voltage device. Thus, the BOSFET device 24 is equivalent to the circuit shown in FIG. 2 of two series-connected vertical conduction high voltage MOSFETs 30 and 31 which are shown connected between terminals 25 and 26. Conventional MOSFETs 30 and 31 are turned on and off by a gate to substrate control voltage which is applied between terminals 32 and 33. The structure and process for manufacture of the BOSFET 24 will be later described in detail.

The control components of FIG. 1 for the BOSFET 24 include diode 35, a PNP transistor 36 and an input resistor 37. Resistor 37 has a very high impedance and can typically be a 5 megohm resistor.

The characteristics of the solid state circuit of FIG. 1 when implemented as later described are similar to those of conventional solid state relays and reed relays which are now in common use. By way of example, the circuit characteristics may be such that the circuit can withstand 400 volts peak between terminals 25 and 26 at a maximum load current of about 200 milliamperes. The on resistance between terminals 25 and 26 is about 25 ohms maximum. The device input capacitance is about 60 to 80 picofarads and the device output capacitance is about 40 picofarads. The capacitance between the input and output circuits is about 2 picofarads. The turn-on time of the circuit with a 5 megohm resistor 37 is approximately 50 microseconds with 10 milliamps drive and its turn-off time is about 90 microseconds. Pickup sensitivity can be increased by increasing the input impedance 37 and the input impedance 37 can also be decreased to increase turn-off speed.

The characteristic of the photovoltaic isolator 20 is shown in FIG. 3 on an exaggerated scale. Thus, as shown in FIG. 3, in about 4 microseconds following the instant that LED 21 turns on, the output voltage of stack 19 rises to approximately 3 volts, when employing an input impedance of about 5 megohms. The drive for the LED in producing the characteristic of FIG. 3 is about 10 milliamperes. The on time will be shortened by employing a higher input impedance 37 or increasing the LED drive. The output voltage of stack 19 will immediately begin to decay with the turn off of the LED 21. This decay would ordinarily take a relatively long time, as shown in dotted lines in FIG. 3, since the gate capacitance of BOSFET 24 slowly discharges in prior art circuits which do not employ the novel diode 35 and PNP transistor 36. With these components in place, however, the PNP transistor 36 will begin to conduct when the output voltage of the stack 19 drops about 0.6 volt less than the MOSFET gate voltage. The input impedance of the circuit is then reduced by the gain of the transistor 36. Thus, as shown in FIG. 3, the stack voltage and gate voltage of BOSFET 24 rapidly collapses to obtain relatively high speed turn-off even though a high input impedance 37 is used for rapid turn-on.

Note that the diode 35 forms a low impedance charging path to the gate circuit of BOSFET 24 to enable high speed turn-on of the device with the full input impedance of resistor 37 in place. Diode 35 is in fact a sensing impedance which could be replaced by other impedances as disclosed in copending application Ser. No. 581,784.

The circuit of FIG. 1 operates as follows:

In order to turn on the relay, LED 21 is excited and a charging current flows from the stack 19. This charging current flows through diode 35 to charge the gate capacitance of BOSFET 24. When the threshold voltage of the BOSFET gate capacitance 24 is exceeded (about 1.0 volt), the novel BOSFET turns on and goes full-on at about 2 to 2.5 volts. A conduction path is then established between terminals 25 and 26. Because of the low current and voltage requirements for the BOSFET 24, a relatively small photoisolator stack 19 can turn on the BOSFET 24.

Note that very rapid response is obtained from the photovoltaic stack 19 since its current feeds into the high input impedance circuit defined by resistor 37. Under ordinary circumstances, this same high input impedance defeats rapid turn-off of the device since, in order to turn off the BOSFET, it is necessary to discharge the gate capacitance through the same impedance. In accordance with the invention, however, the very high performance PNP transistor 36, which has the high gain characteristics, for example, of a static induction transistor (SIT) produces a 20:1 improvement in turn-off speed. As will be later seen, the use of a PNP transistor is compatible with the construction of the BOSFET device 24. Note particularly that the transistor 36 is not used to clamp the photovoltaic isolator 20 but follows its output voltage. Once the output voltage of the stack 19 drops to about 0.6 volt below the gate voltage, transistor 36 turns on. The effective input impedance of the circuit is then the resistance of resistor 37 divided by the beta of transistor 36 which is about 400. Consequently, the effective input circuit becomes a relatively low impedance circuit which can relatively quickly discharge the gate capacitance of the BOSFET 24 to relatively quickly turn it off.

The current transfer characteristics of the circuit of FIG. 1 is shown in FIG. 4. In FIG. 4, when the gate voltage, which is the voltage of the positive output terminal of stack 19 minus the forward drop of diode 35, reaches about 1 volt, the BOSFET 24 begins to turn on. Once approximately 2 volts is reached, the device is almost full on and the load current reached at that time might, for example, be 100 milliamperes. The actual voltage needed to switch BOSFET 24 from a blocking condition to a fully on condition is less than about 3 volts so that the device is operable with TTL circuits.

FIGS. 5-11 show the novel BOSFET 24 in a single chip of silicon along with diode 35, transistor 36 and resistor 37. In one embodiment of the invention, and for the ratings which were previously stated for the overall relay, the chip has a thickness of about 15 mils and a length and width of 71 and 92 mils, respectively. Obviously, other sizes can be used.

The surface of the chip is shown in plan view in FIG. 5 which particularly shows the metallizing pattern for the source and drain electrodes of the BOSFET device 24. Obviously, the single chip shown in FIG. 5 will be one of a large number of chips which are simultaneously produced on a relatively large area wafer.

Referring to FIGS. 5, 6 and 8, the BOSFET device 24 consists of two main drain electrodes 50 and 51, respectively shown with cross-hatching for convenience. Enlarged pad regions 52 and 53 are employed to make electrical contact to the drains 50 and 51 by conventional wire bonding techniques.

Drains 50 and 51 will ultimately be connected to the terminals 25 and 26 of FIG. 1 and each consists of a plurality of spaced elongated fingers, such as drain fingers 54 and 55 which are shown in enlarged detail in FIG. 8. Note that the arrangement of FIG. 5 is exaggerated in detail and in the actual device, approximately fifteen fingers will be used for each drain region.

A plurality of elongated source contacts, including source contacts 56 and 57 are disposed laterally across the chip and are disposed symmetrically between spaced pairs of extending drain fingers. The individual source fingers are electrically connected to one another by a frame containing vertical central conductor 65 and surrounding border 66. Consequently, a current path will be defined, for example, from drain 50 to drain 51 and extends from parallel connected fingers 54 and 55, into the source finger 56, and then to the right along source finger 56 to the drain fingers 58 and 59. All drain and source metals may be aluminum. The bottom surface of the chip can have an electrode secured thereto which is connected to the source border 66. A substrate connection pad 60 is provided on the surface of the device of FIG. 5.

The novel interdigitation type pattern described above uniquely enables the use of a high voltage between the drains 50 and 51 without imposing a high voltage across the gate oxides which control the above current conduction path, as will be later described. Note that parallel conduction paths exist for each of the adjacent pairs of drain electrodes and source electrodes shown in FIG. 5. Also provided on the surface of the device of FIG. 5 is a gate pad 61 which enables an easy bonded connection to the gate circuit of the device, as will also be later described. Note further that the substrate pad 60 of FIG. 5 corresponds to the substrate terminal of BOSFET 24 in FIG. 1 which is connected to the negative output terminal of stack 19 while the gate pad 61 corresponds to the anode of diode 35 which is connected to the positive output terminal of stack 19.

As also shown in FIG. 5, a region of the chip area shown within the dotted line area B, and which will be later described, is reserved for the formation of diode 35 and transistor 36, as is schematically illustrated. The surface of the chip will also carry the resistor 37 around its outer periphery in a manner to be later described but not shown in FIG. 5.

The junction pattern which is used for the novel invention is shown in FIGS. 6 and 8 in connection with the junction pattern of typical area A of FIG. 5. Note that this pattern will be employed over the full surface of the device of FIG. 5.

Referring now to FIGS. 6 and 8, the body of the chip 70 is a lightly doped P(−) region which, as previously stated, has a thickness of about 15 mils and can, for example, have a resistivity of 30 ohm centimeters. The main P(−) region is not in series with the main current path of the device but it determines the breakdown voltage of the BOSFET. A lightly doped N type drift region 71 is then formed in the upper surface of the P(−) body region. The N(−) region 71, sometimes termed a depletion region or drift region, preferably has a depth of about 5 microns and may be formed by conventional epitaxial growth techniques. Preferably, however, layer 71 is novelly formed by ion implantation. The N(−) drift region 71 must be correctly doped in order to obtain correct depletion in a lateral direction during operation of the device so that the field at the device surface will be equally distributed over the surface. Preferably the N(−) region 71 is formed by a phosphorus implantation with a dose of about $1 \times 10^{12}$ ions per cm$^2$. A subsequent drive for about 18 hours at about 1,200° C. follows the implantation in order to diffuse the phosphorus ions to the depth of about 5 microns, as previously described.

A P+ region 72 which includes strips underlying each of the source strips of FIG. 5 is then formed. The lateral sides of the strips such as strip 72 are preferably more lightly doped than the laterally interior section since these regions will define the channels of the MOSFET device to be formed as will be later described.

In forming the strips, such as strip 72 of FIGS. 6 and 8, a field oxide is grown on the surface of region 71 and appropriate narrow strips are opened in the oxide by conventional masking, photolithography and etching. An ion implantation operation then takes place using, for example, boron ions at a relatively heavy dose, for example, $3 \times 10^{14}$ ions per cm$^2$. A subsequent drive for about 100 minutes at 1,200° C. follows the implantation to diffuse the boron ions to a depth of 5 microns or greater.

Thereafter, a masking oxide is grown to about 5,000 Angstroms. A second mask is then applied to the oxide surface and windows are etched on the regions which are to receive a gate and N+ source strips 82 and 83 to be later described. A gate oxide is then grown on the exposed silicon surface to a thickness of about 700 Angstroms. Polysilicon is next deposited over the full surface to a thickness of about 5,000 Angstroms.

A third mask is then applied over the polysilicon surface and the desired polysilicon gate pattern is photolithographically formed on the device surface and the polysilicon exposed by the mask is etched away to the gate oxide. The exposed gate oxide is also etched away and a relatively low ion dose, for example, $3 \times 10^{13}$ ions per cm$^2$ is then applied to form the more lightly doped P type regions 72a and 72b on either side of the P+ strip 72 and beneath the gate oxide. A subsequent drive for about 120 minuts at about 1,125° C. follows the implanation to diffuse the lightly doped region to a depth of 2½ to 3 microns and to grow a masking oxide of approximately 1,500 Angstroms. This masking oxide is used in the formation of the control circuit components, allowing a lightly doped P region to be diffused while preventing the later fomation of an N+ region in the same window. The use of lighter doped P type regions 72a and 72b will reduce the threshold voltage of the BOSFET, as will be described.

A fourth masking and photolithography operation is then employed to open strips in the field oxide, which strips are above drain regions 80 and 81. A fifth masking and photolithography operation is also employed to open strips inthe 1,500 Angstrom masking oxide above source regions 82 and 83 and selected areas of the control circuit. N+ regions 80, 81, 82 and 83 are then conventionally formed as by diffusion. Regions 80 and 81 are N+ strips which underlie drain contact fingers 54 and 55 (FIG. 8). In general, however, the N+ regions 80 and 81 are parts of a digitated pattern having the general shape of the drain electrode 54 in FIG. 5. Obviously, a similar pattern underlying the drain electrode 51 is also formed at the same time. N+ regions 82 and 83 of FIG. 8 are narrow strips which underlie the source finger 56. Thereafter, a protective reflowed oxide coating is appied to the device surface and a masking operation opens window for the necessary metallization including source and drain contacts. Note that source contact finger 56 shorts the N+ regions 82 and 83 to the center of P+ region 72. Clearly, other identical strips underlie the other source strips and are formed within corresponding P type regions, such as the region 72. The N+ strips 82 and 83 define channel regions 72a and 72b which can be inverted to form N type channels for an enhancement type MOSFET action.

Elongated polysilicon gates shown as polysilicon gates 90 and 91 in FIG. 8 overlie the channel regions 72a and 72b, respectively. The oxide thickness beneath the active polysilicon gate region above the channels 72a and 72b is extremely thin and is preferably about 700 Angstroms, thereby to substantially reduce the threshold voltage of the device. The polysilicon gates 90 and 91 are appropriately connected to the gate pad 61 of FIG. 5 and are covered with respective layers 100 and 101 of Silox or a glassy insulation layer which insulates the conductive polysilicon gates 90 and 91 from the source metal strip 56.

It will be noted from the above that the novel process is a DMOS process in that the source and channel regions are self-aligned with the polysilicon gate. Indeed, the process is a triple diffused process if the initial N(−) region 71 is also included.

Figure 8A:
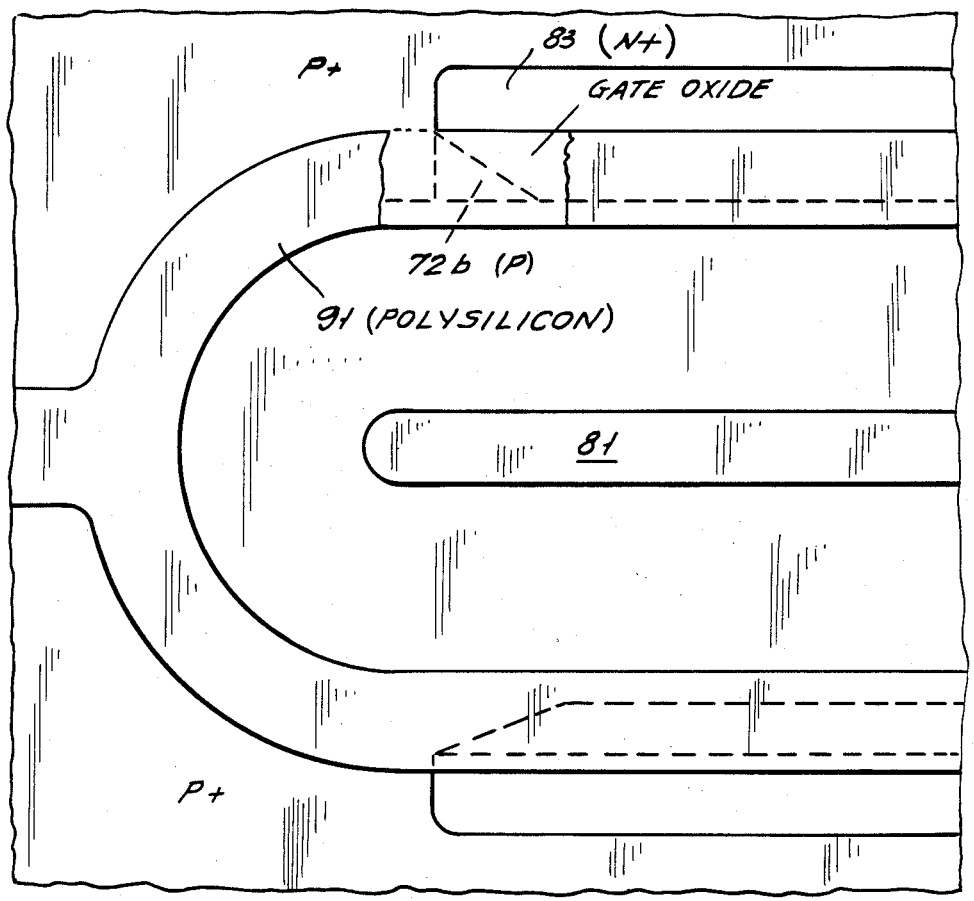
FIG. 8a schematically illustrates the manner in which the gate oxide is terminated short of the area of curvature of the polysilicon gate.

As shown in FIG. 8a, the polysilicon layer 91 encloses the ends of drain regions such as region 81. In accordance with the invention, the gate oxide above the channel and drain regions such as region 72b is terminated just prior to the point at which the polysilicon gate 91 begins its curvature. This prevents exposure of gate oxide to hot carriers in avalanche breakdown, which occurs preferentially in this region of junction curvature. Damage to the gate oxide is thereby avoided and the ruggedness of the device is increased.

There is also present a conventional field oxide layer 93 in FIG. 8 which extends across the entire surface of the device and which has a thickness, for example, of 1.2 microns. Using conventional processing techniques, the oxide layers are appropriately opened and the drain electrodes including drain fingers 54 and 55 and the source electrode strips 56, are deposited as shown. Note that a single metal sheet can be deposited over the surface of the device to make contact to chip surface regions exposed by windows in the masking oxide and the metal can then be masked and cut to the final desired pattern shown, for example, in FIG. 5 and in FIG. 8.

The resulting field effect transistor is a novel lateral bidirectionally conducting field effect transistor (BOSFET) in which relatively high voltage can be connected between drains 50 and 51. When a suitable low voltage, as from a low current source, is applied to the polysilicon gates 90 and 91, the underlying channels 72a and 72b over the full area of the chip of FIG. 5 will be inverted so that current will flow from drains 50 through the inverted channel regions to the source fingers such as source finger 56. The current will then flow outwardly from source finger 56 on the other half of the device again through the inverted underlying channels into the fingers of the drain 51 to establish a current conduction path between the two drain electrodes. Note that although the device is a high voltage device, there is only a very small voltage difference between the polysilicon gate 90-91 and the source fingers such as finger 56 which are clamped to a substrate reference voltage. Therefore, only a few volts will ever appear across the thin oxide layer overlying channel regions 72a and 72b, even though a very high voltage appears between the drain electrodes 50 and 51.

Consequently, the novel device of the invention has general application as an a-c or d-c switching power MOSFET. The current rating of the device is, of course, limited only by the effective width of channels 72a and 72b and, in a device of the size described for FIG. 2 of about 71×92 mils, the current rating is about 200 milliamperes. The threshold voltage of the device is extremely low in view of the thin gate oxide and is about 1 volt with full turn-on occurring at between 2 and 2½ volts. The on resistance of the device is also relatively low and, for example, is less than about 25 ohms.

The spacing between the drain fingers, such as the drain fingers 54 and 55, in the embodiment shown, is about 8 mils center-to-center. The width of the P+ region 72 may be about 1 mil. With an arrangement of this type, it was found that the lateral field stress between any drain region such as regions 81 or 80 to the P+ region 72 is very well distributed along the surface of the wafer immediately beneath the field oxide 93. That is to say, the equipotential lines along the surface are evenly distributed. Consequently, local breakdown due to high localized stress at the surface is avoided.

The novel BOSFET structure described to this point is very well adapted to have the diode 35 and PNP transistor 36 integrated therein in the region B of FIG. 5. The junction pattern employed in the region "B" is shown in detail in FIGS. 7 and 9. Referring to FIGS. 7 and 9, the N(−) region 71 has an enlarged P+ diffusion 110 formed therein at the same time that the P+ diffusion 72 is made. Note in FIG. 7 that the P+ diffusion 72 contains N+ strips 82 and 83 which are identical to those which underlie the source strip 56 in FIG. 8 but that those of FIG. 7 underlie the smaller length source strips on either side of region B in FIG. 5. At the time the P type diffusions 72a and 72b are performed, P type diffusions 111 and 112 are also carried out within the N(−) frame exposed within the P+ rectangular ring 110 of FIG. 7. An N+ contact region 113 and N+ region 114 are also made at the time the N+ regions 82 and 83 are formed.

The circuit and junction pattern defined in FIG. 7 is shown in FIG. 9. Thus, the diode 35 is defined by the PN junction formed between P region 111 and the N+ region 114. The N+ region 114 is electrically connected to the polysilicon gate lattice which is connected to the gate pad 61 in FIG. 5. The anode of diode 35 is electrically connected to the N+ region 113 and is then connected to the positive terminal of the input circuit to the relay.

The PNP transistor 36, which is a very high gain transistor, is formed of the P region 112, the N(−) body 71 and the P(−) body 70. The collector electrode is electrically connected through the P+enclosing ring 110 which is connected to the P(−) body as shown. Region 110 is then electrically connected to the substrate electrode and to the negative terminal of the photostack input. Note that the formation of the PNP transistor is ideally suited to the steps used for producing the BOSFET device and a very high gain transistor is inherently formed.

The resistor 37 of FIG. 1 can be implemented on the chip in any desired manner. Preferably, as shown in FIG. 10, the resistor can encircle the outer periphery of the chip of FIG. 5 and can have a length, for example, from 100 to 200 mils to produce a resistor having a resistance from 1 to 5 megohms. Resistor terminals are preferably formed under the gate pad 61 and in a P+ peripheral region 130 which is formed with the formation of the P+ regions 72.

FIG. 10 schematically illustrates in dotted line 131 a plan view of an N(−) strip region 132 extending around the chip periphery and having its ends spaced by the P+ region 130, as shown in FIG. 11. The strip 132 may have a width, for example, of 15 microns. It is provided with N+ end pads 133 and 134 which are electrically connected to suitable terminals 135 and 136, respectively (FIG. 11) which are then connected to appropriate potential nodes within the chip. Note that the N+ regions 133 and 134 relative to the P+ region 130 define an inherent zener diode 140 (FIG. 11) having a breakover voltage from 10 to 12 volts.

The novel BOSFET structure of the invention can be implemented in other manners. FIGS. 12 and 13 show a second embodiment of a junction pattern which could be used to implement the BOSFET. The junction pattern of FIGS. 12 and 13 should be compared to that of FIG. 8 and similar numerals identify identical parts. The principal difference between the arrangement of FIG. 8 and that of FIGS. 12 and 13 is that the drains D1 and D2 are fully interdigitated. The P+ region 72 of FIG. 8 is formed of two individual laterally spaced sections 150 and 151 in FIG. 13 with a single N+ region 152 disposed centrally between them and connected to the source strip 56. N+ regions 160 and 161 are then formed in the P type regions 150 and 151 to define two channels in each of P regions 150 and 151 which cooperate with pairs of polysilicon gates 162-163 and 164-165, respectively (FIGS. 12 and 13). Gates 162-163 and 164-165 are periodically connected to gate metal strips 170 and 171 respectively.

Figure 14:
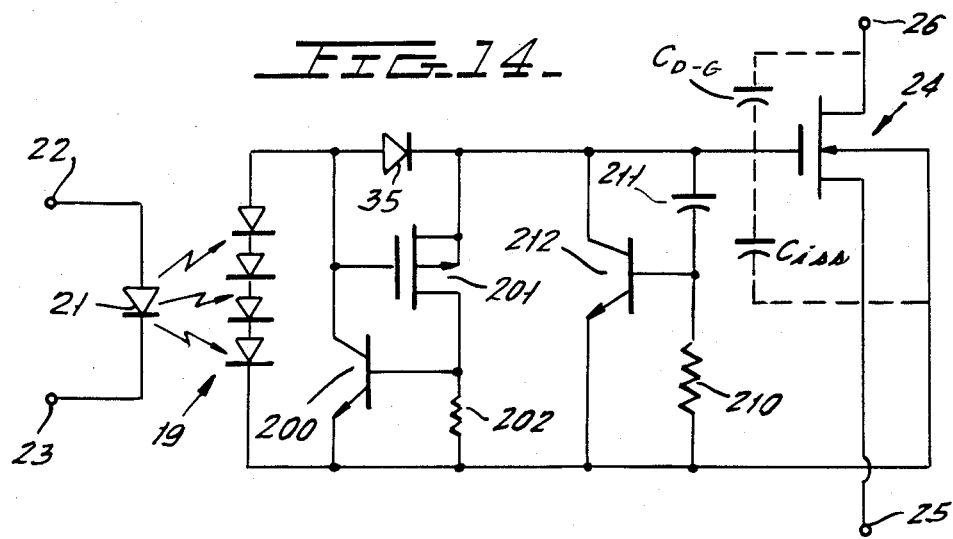
FIG. 14 is a second embodiment of a circuit which can be integrated into the chip of FIGS. 5, 6, 8, 12 and 13.

FIG. 14 shows a circuit which can be integrated into the BOSFET chip previously described, where the circuit has advantages over that of FIG. 1, in regard to increased turn-off speed and independence from unintended dV/dt turnon. Components similar to those of FIG. 1 have been given similar identifying numerals in FIG. 14.

The high speed turn-off circuit in FIG. 14 consists of NPN transistor 200, P channel MOSFET 201 and resistor 202. These form a regenerative turn-off circuit which insures that the voltage on the inherent parasitic gate to substrate capacitance $C_{iss}$ follows, and indeed, pulls down the voltage of stack 19 when LED 21 turns off. Once the stack voltage falls about 0.5 volt below the gate voltage of device 24, P channel MOSFET 201 turns on and $C_{iss}$ discharges through MOSFET 200 and the base to emitter circuit of NPN transistor 20. This turns on transistor 200 to discharge stack 19 and to keep MOSFET 201 turned on during the discharge process. Note that components 35, 200, 201 and 202 are easily integrated into the BOSFET chip.

The switch-off speed of the switching circuit of FIG. 14 is equivalent to the switching speed of the circuit of FIG. 1 with resistor 37 equal to 470 kilohms. The circuit of FIG. 14 does not require as low a value for the discharge resistor 37 and therefore does not load down the photovoltaic pile as much. This improves the pick-up sensitivity and turn-on speed of the circuit, as well as the turn-off speed.

FIG. 14 also provides a dynamic a-c clamping circuit for dV/dt suppression. Thus, the distributed drain-to-gate parasitic capacitance $C_{D-G}$ can permit a sufficiently high pulse current to flow under a large enough dV/dt between terminals 25 and 26 to turn on MOSFET 24 in the absence of an input signal at terminals 22 and 23. The suppression circuit includes resistor 210, capacitor 211 and NPN transistor 212, all of which can be integrated into the power MOSFET chip. The resistance-capacitance divider will act to turn on transistor 212 to ground the node between capacitors $C_{iss}$ and $C_{D-G}$ if the dV/dt across terminals 25 and 26 exceeds a given value.

In the circuit of FIG. 14, resistors 202 and 210 are each 1 megohm, and capacitor 211 is 20 picofarads.

Although the present invention has been described in connection with a number of preferred embodiments thereof, many variations and modifications will now become apparent to those skilled in the art. It is preferred, therefore, that the present invention be limited not by the specific disclosure herein, but only by the appended claims.

What is claimed is:

1. A bidirectional conduction insulated gate field effect transistor; said transistor comprising a high resistivity body of one of the conduction types; a shallow high resistivity implanted region of the other of the conductivity types formed by implantation and drive into one surface of said body; first and second laterally displaced drain regions of said other conductivity type formed in said implanted region; a central region of said one of the conductivity types formed in said implanted region and located centrally between and spaced from said drain regions, and extending completely through said implanted region; a source region means of said other conductivity type formed in the surface of said central region and defining two opposed channel means in said central region which can be inverted from said one conductivity type to said other conductivity type; insulated gate means disposed above the surface of said central region and aligned with said two opposed channel means, and a gate insulation layer disposed between said two opposed channel means and said gate means; first and second drain electrode means connected to said first and second drain regions, respectively; and source electrode means connected to said source region means, to provide a biasing reference for said gate means, and to said central region, said source electrode means being disposed adjacent said gate means and insulated therefrom, whereby current can flow bidirectionally between said drain electrode means and through said source electrode when said channel means is inverted by a voltage on said gate means.

2. The device of claim 1, wherein said one conductivity type is the P type and wherein said other conductivity type is an N type.

3. The device of claim 1, wherein said implanted region has a depth of about 5 microns.

4. The device of claim 1, wherein said gate insulation layer has a thickness of about 700 Angstroms.

5. The device of claim 1, wherein said source means includes two spaced source regions which define first and second respective channels in said central region.

6. The device of claim 1, wherein said central region beneath and leading to said channel means has a lower conductivity than the remainder of said central region.

7. The device of claim 6, wherein the lateral edges of the lower conductivity portion of said central region are defined by the same diffusion window as said source region means, and are thereby self-aligned to said source region means.

8. The device of claim 1, wherein said drain regions, said central region, and said source region means include parallel elongated strips spaced from one another.

9. The device of claim 8 which includes third and fourth drain regions disposed on opposite sides of said central region and aligned with, but axially displaced from said first and second drain regions, said source region means have a first portion extending from one end of said central region disposed between said first and second drain regions and a second portion extending from the opposite end of said central region between said third and fourth drain regions; and third and fourth drain electrode means connected to said third and fourth drain regions; said first and second drain electrode means connected to one another to form a first common power terminal; said third and fourth drain regions connected to one another to form a second common power terminal, whereby bidirectional current can flow between said first and second power terminals when said channel means is inverted.

10. The device of claim 9, wherein said first and second drain regions are elements of a first digitated drain region having a plurality of fingers substantially identical in cross-section to said first and second drain regions and wherein said third and fourth drain regions are elements of a second digitated drain region having a plurality of fingers substantially identical to said third and fourth drain regions; and wherein a respective central region and source means and channel means is disposed between respective pairs of fingers of said first and second digitated drain regions.

11. The device of claim 1, 9 or 10, wherein said one conductivity type is the P type and wherein said other conductivity type is an N type.

12. The device of claim 1, 9 or 10, wherein said source means includes two spaced source regions which form first and second channels in said central region.

13. The device of claim 1, 9 or 10, wherein the portion of said central region beneath and leading to said channel means has a lower conductivity than the remainder of said central region.

14. The device of claim 2 or 9 which further includes a diode and a PNP transistor integrated with said body; said diode comprising a P type diode region formed within said implanted region and an N type region formed within said P type diode region; said PNP transistor comprising a P type transistor emitter region formed in said implanted region, the base region of said PNP transistor consisting of said implanted region, and the collector region of said PNP transistor consisting of said P type body.

15. The device of claim 14 which further includes a resistor integrated into said body; said resistor consisting of an isolated high resistivity strip extending around at least a portion of the outer periphery of the surface of said body.

16. A bidirectional conduction insulated gate field effect transistor comprising: a high resistivity body of one of the conductivity types; a shallow high resistivity layer of the other of the conductivity types on the top of said body; first and second colinear elongated drain regions of said other conductivity type formed in the surface of said high resistivity layer, with their adjacent ends spaced from one another; an elongated central region of said one conductivity type formed in the surface of said high resistivity layer and extending parallel to and laterally spaced from said first and second drain regions and dividing one from the other; a source region means of said one conductivity type formed in the surface of said central region and extending coextensively therewith; the edges of said source region being spaced from the edges of said central region to define two opposed elongated channel means which can be inverted from said other conductivity type to said one conductivity type; a gate insulation layer on the surface of said body and overlying said two opposed elongated channel means, and a gate electrode disposed atop said gate insulation layer; an elongated source electrode connected to said source region means to provide a biasing reference for said gate electrode; said source electrode being disposed adjacent to but insulated from said gate electrode; and first and second drain electrodes connected to said first and second drain regions, whereby current can flow bidirectionally between said first and second drain electrodes when said channel means is inverted.

17. The device of claim 16, wherein said one conductivity type is the P type and wherein said other conductivity type is an N type.

18. The device of claim 16, wherein said high resistivity layer is formed by implantation and has a thickness of about 5 microns.

19. The device of claim 16, wherein said gate insulation layer has a thickness of about 700 Angstroms.

20. The device of claim 16, wherein said source means includes two spaced source regions which form first and second channels.

21. The device of claim 16, wherein said central region beneath and leading to said channel means has a lower conductivity than the remainder of said central region.

22. The device of claim 16, wherein said first and second drain regions are elements of first and second digitated drain regions each having a plurality of parallel fingers identical in cross-section to said first and second regions, respectively; and wherein elongated central regions and source regions identical to said central region and said source region means are disposed between adjacent pairs of drain region fingers in each of said first and second digitated drain regions.

23. The device of claim 6 or 21, wherein said lower conductivity region of said central region and said source region are formed through a common diffusion window and are self-aligned relative to one another.

24. A bidirectional conduction insulated gate field effect transistor having a pair of main current electrodes, comprising, in a single chip: a substrate of one conductivity type with a high resistivity surface layer of the opposite conductivity type;
  first P-N junctions defining a first lateral conduction field effect transistor; second P-N junctions defining a second lateral conduction field effect transistor;
  a semiconductor region of one conductivity type formed in said surface layer containing a common source or drain region of an opposite conductivity type for the first and second field effect transistors; said semiconductor region having respective channel regions for the first and second transistors; and respective gate portions dielectrically spaced from the respective channel regions and being connected together so as to be at the same electric potential and to serve as a single gate for the first and second field effect transistors; and an electrode connected to said source or drain region and to said semiconductor region and providing a reference potential for biasing said gate.

25. The device of claim 1 or 16, which further includes a regenerative turn-off circuit integrated into said body; said turn-off circuit comprising a MOSFET and a bipolar transistor regeneratively coupled to each other and connected across said gate and source means, and further comprising a sensing diode connected across a gate of said MOSFET and said gate means to turn on said MOSFET and said bipolar transistor when the voltage across said diode surpasses a predetermined level, thereby to rapidly discharge the gate capacitance of the field effect transistor.

26. The device of claim 25, which further comprises a dynamic a-c clamping circuit integrated into said body; said clamping circuit including a bipolar transistor connected across said gate and source means, and further including a series-connected capacitor and resistor connected across said gate and source means; the node between said capacitor and said resistor connected to the base of said bipolar transistor to turn on the same under high dV/dt conditions and thereby prevent spurious turn-on of the field effect transistor.

27. The device of claim 24, which further includes a regenerative turn-off circuit integrated into said body; said turn-off circuit comprising a MOSFET and a bipolar transistor regeneratively coupled to each other and connected across said gate and source means, and further comprising a sensing diode connected across a gate of said MOSFET and said gate means to turn on said MOSFET and said bipolar transistor when the voltage across said diode surpasses a predetermined level, thereby to rapidly discharge the gate capacitance of the field effect transistor.

28. The device of claim 27, which further comprises a dynamic a-c clamping circuit integrated into said body; said clamping circuit including a bipolar transistor connected across said gate and source means, and further including a series-connected capacitor and resistor connected across said gate and source means; the node between said capacitor and said resistor connected to the base of said bipolar transistor to turn on the same under high dV/dt conditions and thereby prevent spurious turn-on of the field effect transistor.

* * * * *